(12) United States Patent
Chen et al.

(10) Patent No.: US 12,550,471 B2
(45) Date of Patent: Feb. 10, 2026

(54) SEMICONDUCTOR DEVICES AND METHODS OF FORMING THE SAME (71) Applicant: TAIWAN SEMICONDUCTOR MANUFACTURING COMPANY, LTD., Hsinchu (TW)

(72) Inventors: Wei-Lin Chen, Tainan (TW); Yu-Cheng Tsai, Tainan (TW); Chun-Hao Chou, Tainan (TW); Kuo-Cheng Lee, Tainan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 636 days.

(21) Appl. No.: 17/584,968

(22) Filed: Jan. 26, 2022

(65) Prior Publication Data

US 2023/0041837 A1    Feb. 9, 2023

Related U.S. Application Data

(60) Provisional application No. 63/230,357, filed on Aug. 6, 2021.

(51) Int. Cl.
*H10F 39/00* (2025.01)

(52) U.S. Cl.
CPC ......... *H10F 39/811* (2025.01); *H10F 39/014* (2025.01); *H10F 39/8037* (2025.01); *H01L 2225/06503* (2013.01)

(58) Field of Classification Search
CPC ....... H01L 27/146–14669; H01L 2225/06503; H10F 39/811; H10F 39/014; H10F 39/8037
See application file for complete search history.

(56) References Cited

U.S. PATENT DOCUMENTS

| | | | |
|---|---|---|---|
| 2008/0157152 A1* | 7/2008 | Shim | H10F 39/803 257/292 |
| 2016/0020235 A1* | 1/2016 | Yamashita | H10F 39/811 250/206 |
| 2016/0360127 A1* | 12/2016 | Dierickx | H04N 25/771 |
| 2020/0260026 A1* | 8/2020 | Ono | H04N 25/51 |
| 2020/0389608 A1* | 12/2020 | Baek | H04N 25/778 |
| 2022/0406834 A1* | 12/2022 | Horikoshi | H10D 1/692 |

\* cited by examiner

*Primary Examiner* — Britt Hanley
*Assistant Examiner* — Casey Paul Boatman
(74) *Attorney, Agent, or Firm* — NZ Carr Law Office (57) ABSTRACT

A semiconductor device includes an image sensor structure and a periphery device structure. The image sensor structure includes a first semiconductor substrate, a first interconnect structure, a radiation device, a transfer gate transistor electrically coupled to the radiation device, a floating diffusion region electrically coupled to the transfer gate, and a first capacitor disposed in the first interconnect structure. The transfer gate transistor electrically interconnects and disconnects the radiation device and the floating diffusion region. The periphery device structure includes a second interconnect structure disposed on the first interconnect structure, a second semiconductor substrate disposed on the second interconnect structure, a plurality of logic devices disposed in the second semiconductor substrate, and a second capacitor disposed in the second interconnect structure. The first capacitor and the second capacitor are electrically coupled to the floating diffusion region.

20 Claims, 8 Drawing Sheets

SEMICONDUCTOR DEVICES AND METHODS OF FORMING THE SAME

BACKGROUND

In the formation of the image sensor chips, the image sensors (such as the photo diodes) and logic circuits are formed on a silicon substrate, such as a silicon wafer, followed by the formation of an interconnect structure on a front side of the silicon substrate. The silicon substrate is then thinned, and backside structures such as color filters and micro-lenses are formed on the backside of the silicon substrate.

The image sensors in the image sensor chips generate electrical signals in response to the stimulation of photons. The magnitudes of the electrical signals (such as the currents) depend on the intensity of the incident light received by the respective image sensors. For the application of a high dynamic range, a high capacitance component design of the image sensors is needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
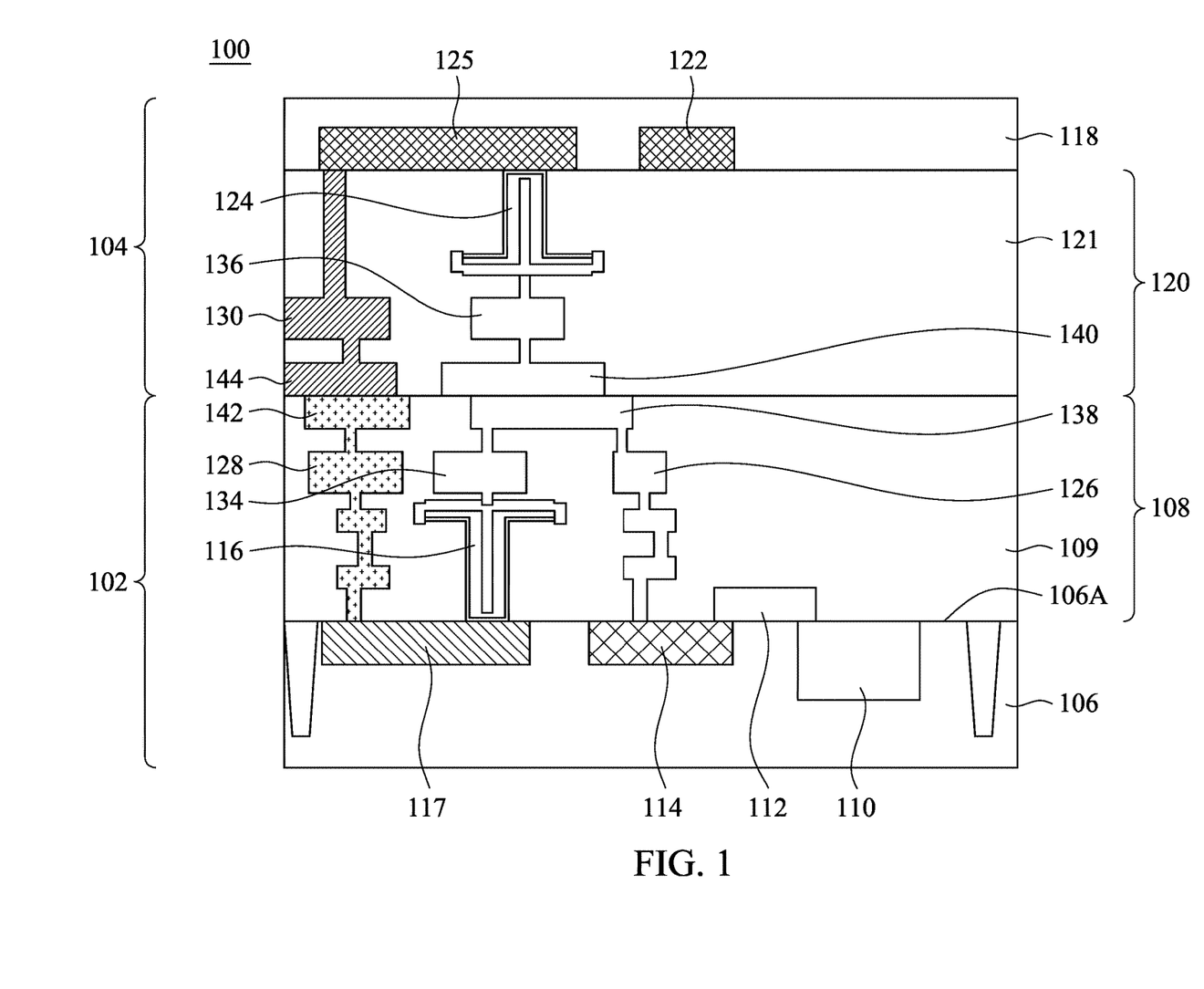
FIG. 1 is a cross-section side view of a semiconductor device, in accordance with some embodiments.

FIG. 1 is a cross-section side view of a semiconductor device 100, in accordance with some embodiments. The semiconductor device 100 may include an image sensor structure 102 and a periphery device structure 104, as shown in FIG. 1. The image sensor structure 102 may include a semiconductor substrate 106 including one or more image sensors formed therein. The image sensor may include a radiation device 110 disposed in the semiconductor substrate 106, a transfer gate transistor 112 disposed on the semiconductor substrate 106 and electrically coupled to the radiation device 110, and a floating diffusion region 114 disposed in the semiconductor substrate 106 and electrically coupled to the transfer gate 112. The transfer gate transistor 112 may electrically connect and disconnect the radiation device 110 and the floating diffusion region 114. The image sensor may further include a capacitor 116 disposed in an interconnect structure 108 disposed over the semiconductor substrate 106.

In some embodiments, the image sensor may be a backside illumination (BSI) image sensor. In some embodiments, the semiconductor substrate 106 may be a crystalline silicon substrate or a semiconductor substrate formed of other semiconductor materials. For the purpose of better describing the present disclosure, the surface 106A in FIG. 1 is referred to as a front surface of the semiconductor substrate 106, and the opposite surface is referred to as a back surface of the semiconductor substrate 106. In some embodiments, the image sensor may be formed at the front surface 106A of the semiconductor substrate 106. The image sensor is configured to convert light signals (photons) to electrical signals. In some embodiments, the image sensor may include photo-sensitive Metal-Oxide-Semiconductor (MOS) transistors or photo-sensitive diodes.

In some embodiments, the radiation device 110 may include photo diodes, or other types of image sensing elements. In some embodiments, the radiation device 110 may extend from the front surface 106A into the semiconductor substrate 106 and form an image sensor array. In some embodiments, each of radiation device 110 may be electrically coupled to a first source/drain region of the transfer gate transistor 112. The floating diffusion region 114 is formed in the semiconductor substrate 106, for example, through implanting into the semiconductor substrate 106 to form a p-n junction. The floating diffusion region 114 may be electrically coupled to a second source/drain region of the transfer gate transistor 112. The transfer gate transistor 112 may electrically connect and disconnect the radiation device 110 and the floating diffusion region 114. For example, by applying a control voltage on the gate electrode, the first and second source/drain regions of the transfer gate transistor 112 can be connected or disconnected, and the radiation device 110 and the floating diffusion region 114 can be connected or disconnected.

The image sensor structure 102 may further include the capacitor 116 disposed in the interconnect structure 108. A first end of the capacitor 116 may be electrically coupled to the floating diffusion region 114 through a top metal layer 134, a redistribution layer (RDL) 138, and a plurality of conductive features 126, and when the radiation device 110 and the floating diffusion region 114 are connected, the capacitor 116 may be used to store the charges generated by the radiation device 110. For example, when the radiation device 110, e.g., the photo diode, is exposed to an incident light, the radiation device 110 may generate electrical charges, and the amount of the charges is related to the intensity or the brightness of the incident light. When the radiation device 110 and the floating diffusion region 114 are connected, the electrical charges may be stored in the capacitor 116. The capacitor 116 may be connected to the top metal layer 134 by a conductive via, and the top metal layer 134 may be connected to the RDL by a conductive via. In some embodiments, additional conductive lines and vias may be disposed between the capacitor 116 and the top metal layer 134, and additional conductive lines and vias may be disposed between the top metal layer 134 and the RDL 138.

The image sensor structure 102 may further include a conductive feature 117 electrically coupled to a second end of the capacitor 116 opposite the first end. A plurality of conductive features 128 connects the conductive feature 117 to another RDL 142. In some embodiments, the plurality of conductive features 126 and the plurality of conductive features 128 may include conductive vias and conductive lines, which are formed and stacked by a plurality of processes. The capacitor 116, the top metal layer 134, the RDLs 138, 142, the plurality of conductive features 128, and the plurality of conductive features 126 may be disposed in a dielectric material 109. In some embodiments, the dielectric material 109 includes a plurality of intermetal dielectric (IMD) layers. In some embodiments, the IMD layer includes a low-k dielectric material, such as SiOCH.

The periphery device structure 104 may include an interconnect structure 120 disposed on the interconnect structure 108 of the image sensor structure 102 and a semiconductor substrate 118 disposed on the interconnect structure 120. In some embodiments, the semiconductor substrate 118 may include a silicon substrate. In some embodiments, the semiconductor substrate 118 may be formed of other semiconductor materials such as silicon germanium, silicon carbon, III-V compound semiconductor materials, or the like. A plurality of devices 122 may be formed in the semiconductor substrate 118. In some embodiments, the devices 122 may be a logic circuit including a plurality of transistors.

In some embodiments, the devices 122 may include logic circuits, such as a plurality of transistors, row selectors, source followers, and reset transistors. In some embodiments, the row selectors, the source followers, and the reset transistors may form a plurality of pixel unit portions.

A capacitor 124 is disposed in the interconnect structure 120, as shown in FIG. 1. A first end of the capacitor 124 may be electrically coupled to a RDL 140 via a metal layer 136, and a second end of the capacitor 124 opposite the first end may be electrically coupled to a conductive feature 125. The metal layer 136 may be a top metal layer before the interconnect structure 120 is flipped over and bonded to the interconnect structure 108. One or more conductive vias may be disposed between the first end of the capacitor 124 and the metal layer 136 and between the metal layer 136 and the RDL 140.

As shown in FIG. 1, the conductive feature 125 is electrically connected to a RDL 144 by a plurality of conductive features 130. The plurality of conductive features 130 may include conductive vias and conductive lines. The capacitor 124, the metal layer 136, the RDLs 140, 144, and the plurality of conductive features 130 may be disposed in a dielectric material 121. In some embodiments, the dielectric material 121 includes a plurality of IMD layers. In some embodiments, the IMD layer includes a low-k dielectric material, such as SiOCH.

As shown in FIG. 1, the image sensor structure 102 and the periphery device structure 104 are bonded via hybrid bonding of the interconnect structures 108, 120. For example, the RDLs 138, 142 of the interconnect structure 108 are bonded to the RDLs 140, 144 of the interconnect structure 120, respectively, and the dielectric material 109 of the interconnect structure 108 is bonded to the dielectric material 121 of the interconnect structure 120.

The first ends of the capacitors 116, 124 are electrically connected via the top metal layer 134, the RDLs 138, 140, the metal layer 136, and the conductive vias. The second ends of the capacitors 116, 124 are electrically connected via the conductive feature 117, the plurality of conductive features 128, the RDLs 142, 144, the plurality of conductive features 130, and the conductive feature 125. By electrically coupling the first end of the capacitor 124 and the first end of the capacitor 116, and electrically coupling the second end of the capacitor 124 and the second end of the capacitor 116, the capacitor 124 and the capacitor 116 may form a parallel connection, and the capacitance of the parallel connection can be the sum of the capacitance of the capacitor 124 and the capacitance of the capacitor 116.

When the radiation device 110, e.g., the photo diode, is exposed to an incident light, the radiation device 110 may generate electrical charges, and the amount of the charges is related to the intensity or the brightness of the incident light. When the radiation device 110 and the floating diffusion region 114 are connected, the electrical charges may be stored in both the capacitor 116 and the capacitor 124, and the capacitance can be the sum of the capacitance of the capacitor 124 and the capacitance of the capacitor 116. When the image sensor structure 102 is operated in a high dynamic range, the semiconductor device 100 may need a large capacitor to store a large number of electrical charges, and the parallel connection of the capacitor 116 and the capacitor 124 located in different structures, e.g., in image sensors and in logic circuits, may provide an improved capacitor to achieve the application.

In some embodiments, the capacitor 116 and/or the capacitor 124 located in different structures may be metal-insulator-metal (MIM) capacitors. The MIM capacitors may be implemented into the back-end-of-the-line (BEOL) metal interconnect layers of integrated chips. The MIM capacitors may have a top metal plate and a bottom metal plate separated by a capacitor dielectric layer. In some embodiments, the capacitor dielectric layer may include high-k dielectric materials. The high-k dielectric materials may have a relatively high dielectric constant allow for a MIM capacitor to store energy within a smaller chip area. In some embodiments, the high-k materials used in MIM capacitors may include $HfO_2$, $ZrO_2$, $Ta_2O_5$, SrO, $La_2O_5$, and $TiO_2$.

Figure 2:
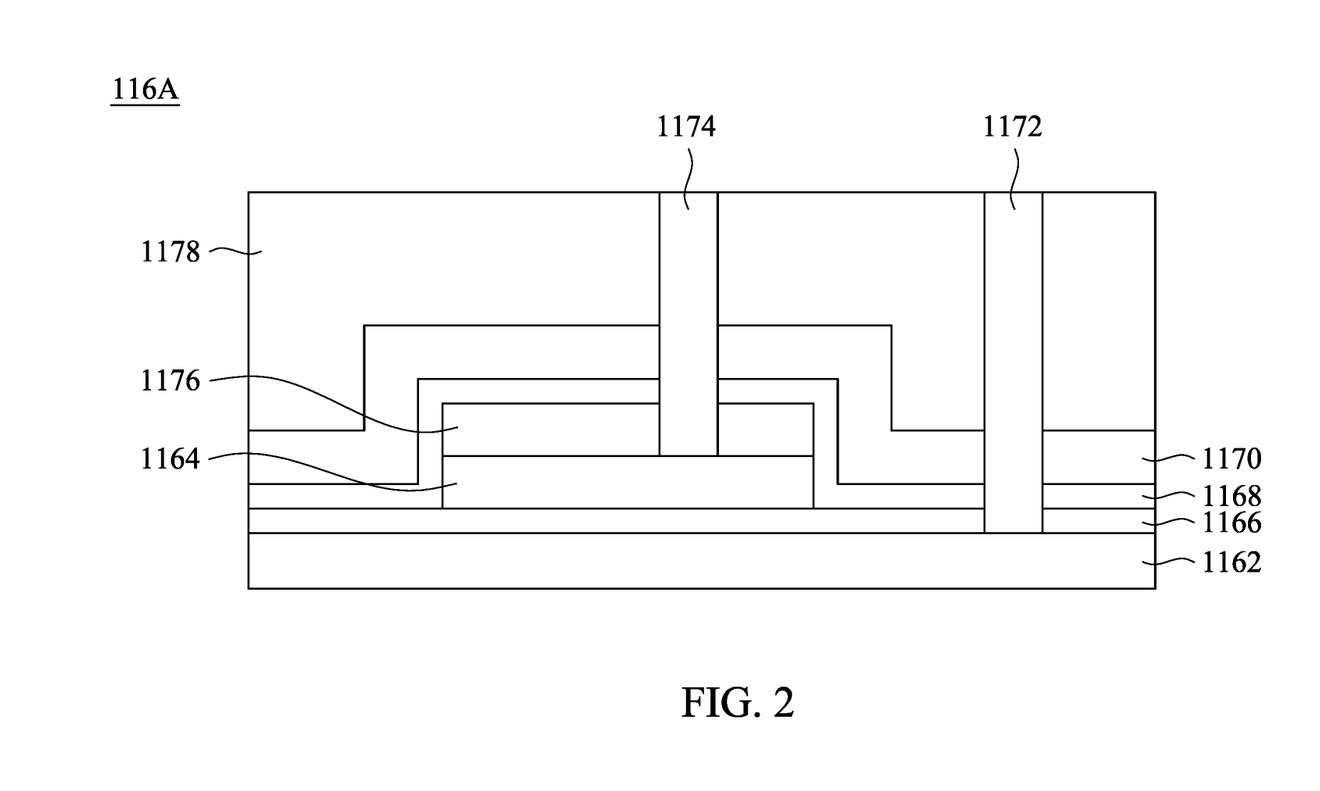
FIG. 2 is a cross-section side view of a capacitor, in accordance with some embodiments.

FIG. 2 is a cross-section side view of a two-dimensional (2D) MIM capacitor 116A, in accordance with some embodiments. The 2D MIM capacitor 116A may be the capacitor 116 and/or the capacitor 124. The 2D MIM capacitor 116A may include a capacitor bottom metal (CBM) layer 1162 and a capacitor top metal (CTM) layer 1164. In some embodiments, the CBM layer 1162 and the CTM layer 1164 may include one or more of aluminum (Al), titanium (Ti), titanium nitride (TiN), tantalum (Ta), tantalum nitride (TaN), tungsten (W), tungsten nitride (WN), copper (Cu), platinum (Pt), palladium (Pd), or other suitable materials. The CBM layer 1162 is separated from the CTM layer 1164 by a capacitor dielectric layer 1166. In some embodiments, the capacitor dielectric layer 1166 may include one or multiple laminated dielectric layers. By separating the CBM layer 1162 from the CTM layer 1164 with the capacitor dielectric layer 1166, charges can accumulate on the CBM layer 1162 and the CTM layer 1164.

In some embodiments, the capacitor dielectric layer 1166 may include high-k dielectric layers alternating with high-energy band gap layers. A conductive via 1172 and a conductive via 1174 are configured to provide electrical connections to the CBM layer 1162 and the CTM layer 1164, respectively. In some embodiments, a masking layer 1176 is disposed over the CTM layer 1164. In some embodiments, the masking layer 1176 may include silicon nitride (SiN), protective silicon oxy-nitride (e.g., PE-SiON), or silicon carbide (SiC). A capping layer 1168 may be disposed onto the masking layer 1176 and the capacitor dielectric layer 1166. In some embodiments, the capping layer 1168 may include silicon oxide (SiO). In some embodiments, an etch stop layer 1170 may be disposed over the capping layer 1168. In some embodiments, the etch stop layer 1170 may include SiN, SiON, or SiC. In some embodiments, an inter-level dielectric (ILD) layer 1178 (e.g., an oxide, a low-k dielectric, an ultra low-k dielectric, etc.) is disposed over the etch stop layer 1170. The ILD layer 1178 may be the dielectric material 109 of the interconnect structure 108 or the dielectric material 121 of the interconnect structure 120.

Figure 3:
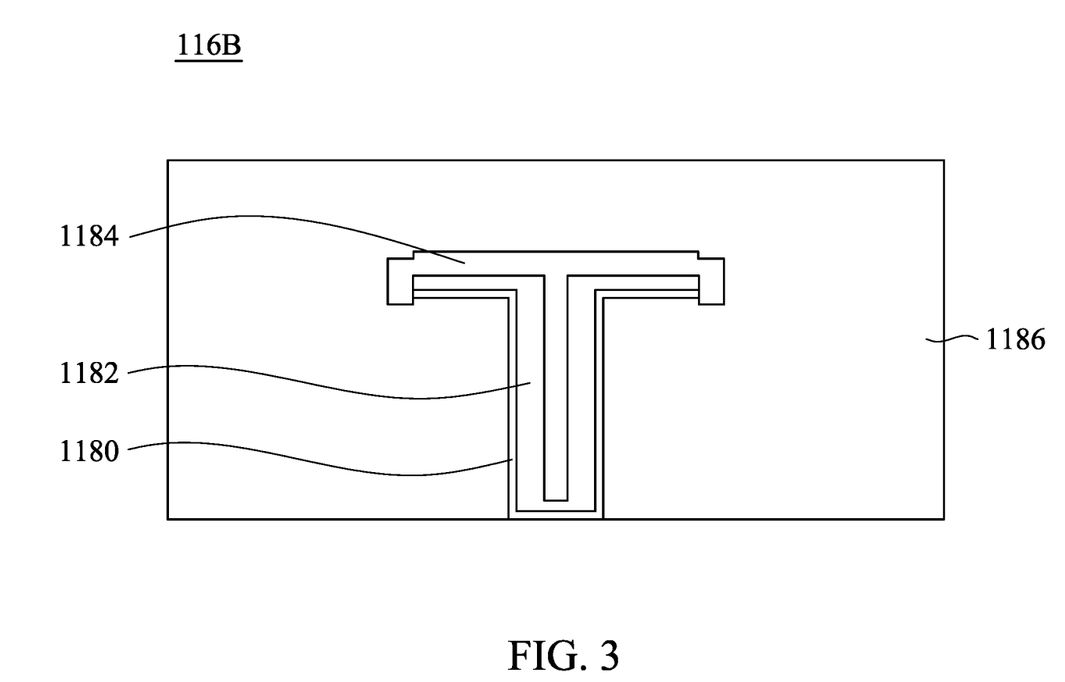
FIG. 3 is a cross-section side view of another capacitor, in accordance with some embodiments.

In some embodiments, the capacitor 116 and/or the capacitor 124 located in different structures may be three-dimensional (3D) MIM capacitors. FIG. 3 is a cross-section side view of a 3D MIM capacitor 116B, in accordance with some embodiments. The 3D MIM capacitor 116B may be the capacitor 116 and/or the capacitor 124. In some embodiments, the 3D MIM capacitor 116B may be formed across a plurality of ILD layers 1186, which may be the dielectric material 109 of the interconnect structure 108 or the dielectric material 121 of the interconnect structure 120.

A conductive bottom electrode 1180 and a conductive top electrode 1184 may be formed in the ILD layers 1186 as a first end and a second end of the 3D MIM capacitor 116A, and a capacitor dielectric layer 1182 may be formed between the conductive bottom electrode 1180 and the conductive top electrode 1184. In some embodiments, a via (not shown) may be formed in the ILD layers 1186, and a barrier (not shown) may be formed in the via. Then, the conductive bottom electrode 1180 may be formed on the barrier layer. The capacitor dielectric layer 1182 is formed on the conductive bottom electrode 1180, and the conductive top electrode 1184 is formed on the capacitor dielectric layer 1182.

In some embodiments, the conductive bottom electrode 1180 and the conductive top electrode 1184 may include one or more of Al, Ti, TiN, Ta, TaN, W, WN, Cu, Pt, Pd, or other suitable materials. In some embodiments, the capacitor dielectric layer 1182 may include one or multiple laminated dielectric layers. In some embodiments, the capacitor dielectric layer 1182 may include high-k dielectric layer, or other suitable materials.

Figure 4:
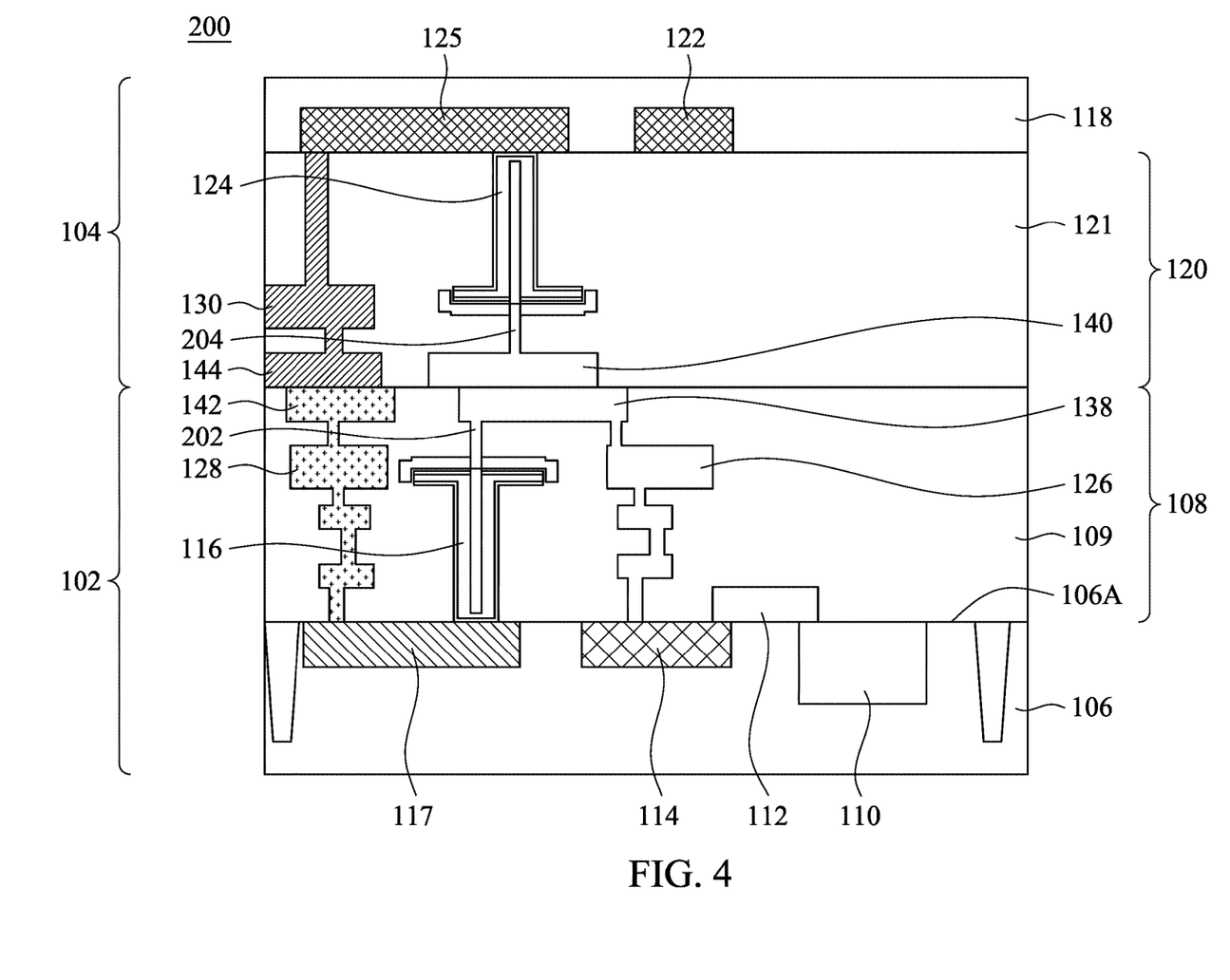
FIG. 4 is a cross-section side view of another semiconductor device, in accordance with some embodiments.

FIG. 4 is a cross-section side view of a semiconductor device 200, in accordance with some embodiments. In some embodiments, the semiconductor device 200 may be similar to the semiconductor device 100. In some embodiments, the semiconductor device 200 does not include the top metal layer 134 and the metal layer 136 in the semiconductor device 100. In other words, the RDL 138 is electrically connected to the first end of the capacitor 116 by a via 202, and the RDL 140 is electrically connected to the first end of the capacitor 124 by a via 204.

The via 202 may be landed on the first end of the capacitor 116, and the via 204 may be landed on the first end of the capacitor 124. The vias 202, 204 may have deeper trench than using the top metal layer 134 and the metal layer 136 in the semiconductor device 100.

Figure 5:
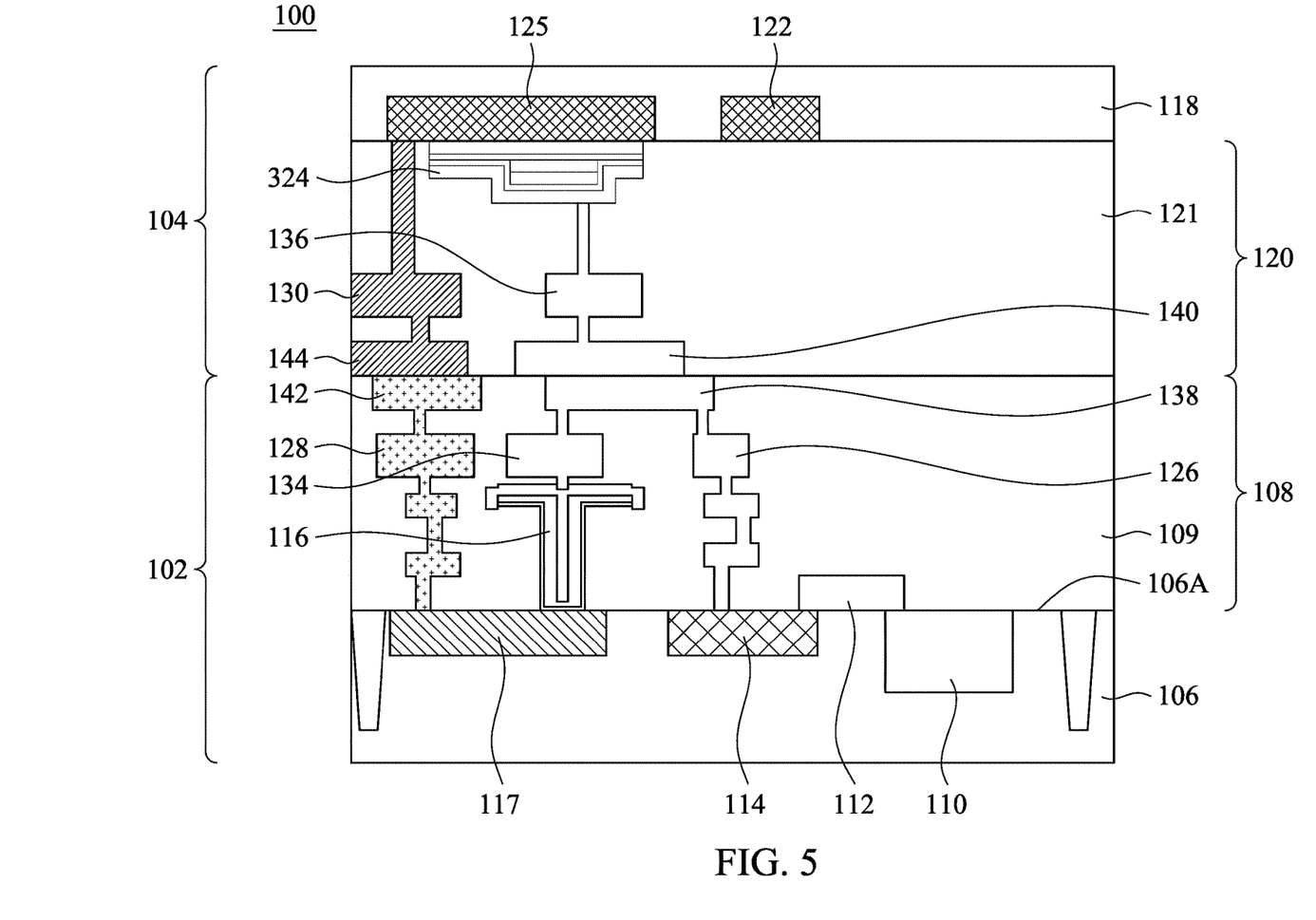
FIG. 5 is a cross-section side view of still another semiconductor device, in accordance with some embodiments.

FIG. 5 is a cross-section side view of a semiconductor device 300, in accordance with some embodiments. The semiconductor device 300 may include the image sensor structure 102 and the periphery device structure 104, as shown in FIG. 5. The image sensor structure 102 may include the semiconductor substrate 106 including one or more image sensors formed therein. The image sensor may include the radiation device 110 disposed in the semiconductor substrate 106, the transfer gate transistor 112 disposed on the semiconductor substrate 106 and electrically coupled to the radiation device 110, and the floating diffusion region 114 disposed in the semiconductor substrate 106 and electrically coupled to the transfer gate 112. The transfer gate transistor 112 may electrically connect and disconnect the radiation device 110 and the floating diffusion region 114. The image sensor may further include the capacitor 116 disposed in the interconnect structure 108 disposed over the semiconductor substrate 106.

The periphery device structure 104 may include the interconnect structure 120 disposed on the interconnect structure 108 of the image sensor structure 102 and the semiconductor substrate 118 disposed on the interconnect structure 120. The plurality of devices 122 may be formed in the semiconductor substrate 118. In some embodiments, the devices 122 may be a logic circuit including a plurality of transistors. A capacitor 324 is disposed in the interconnect structure 120, as shown in FIG. 5. The first end of the capacitor 324 may be electrically coupled to the RDL 140 via the metal layer 136, and the second end of the capacitor 324 opposite the first end may be electrically coupled to the conductive feature 125. The metal layer 136 may be a top metal layer before the interconnect structure 120 is flipped over and bonded to the interconnect structure 108. One or more conductive vias may be disposed between the first end of the capacitor 324 and the metal layer 136 and between the metal layer 136 and the RDL 140.

As shown in FIG. 5, in some embodiments, the capacitor 116 may be a 3D MIM capacitor, and the capacitor 324 may be a 2D MIM capacitor. In other words, the capacitors formed in the image sensor structure 102 and the periphery device structure 104 are not limited to the same type of capacitor. For example, the capacitor formed in the image sensor structure 102 may be a 2D MIM capacitor or a 3D MIM capacitor. In another example, the capacitor formed in the periphery device structure 104 may be a 2D MIM capacitor or a 3D MIM capacitor.

Figure 6:
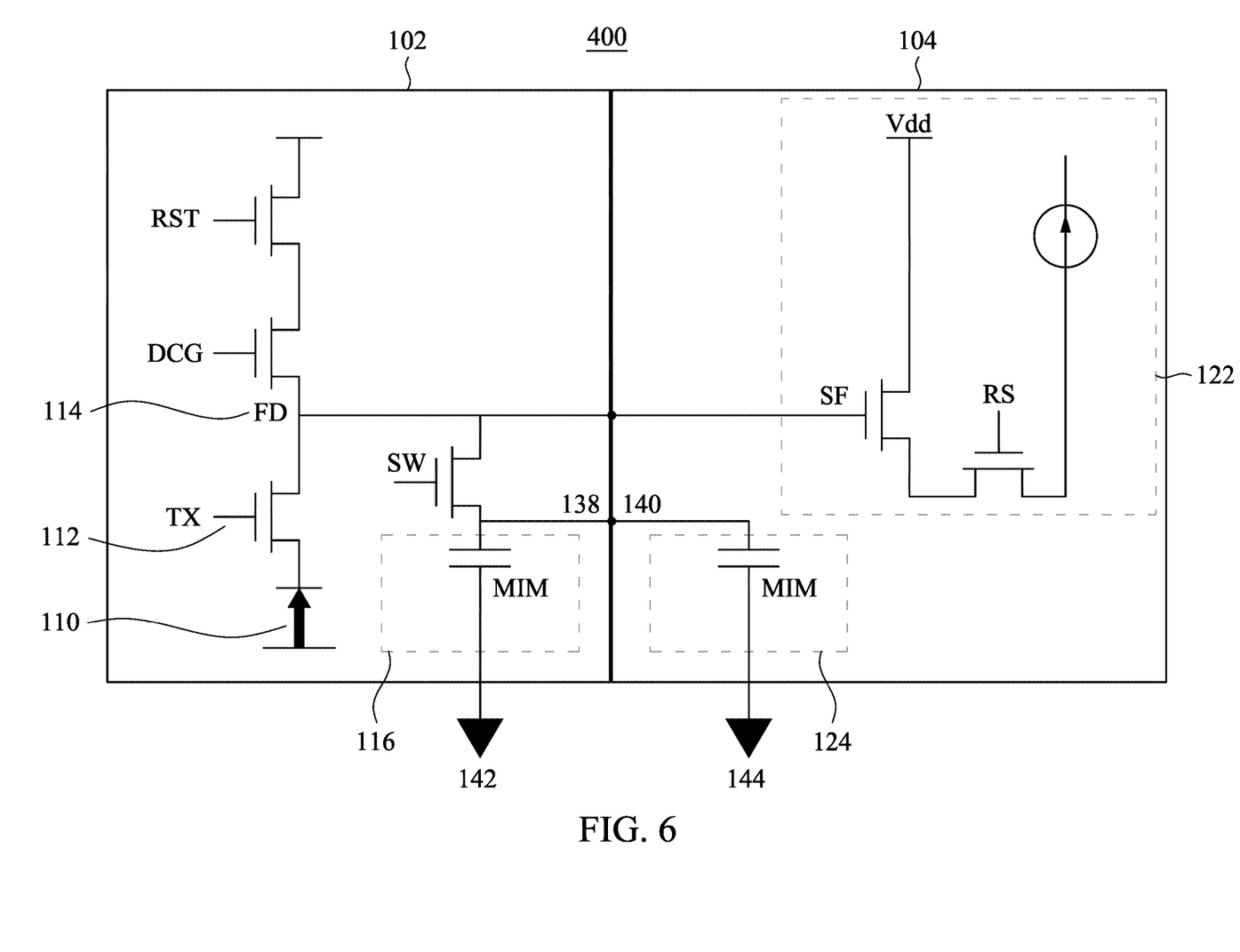
FIG. 6 is a circuit diagram of a semiconductor device, in accordance with some embodiments.

FIG. 6 is a circuit diagram 400 of the semiconductor device 100, in accordance with some embodiments. As shown in FIG. 6, the first end of the capacitor 116 and the first end of the capacitor 124 are bonded together through the RDL 138 and the RDL 140. The second end of the capacitor 116 and the second end of the capacitor 124 are respectively connected to the RDL 142 and the RDL 144. In some embodiments, the RDL 142 and the RDL 144 may be directly or electrically bonded together, as shown in FIG. 1. By electrically coupling the first end of the capacitor 124 and the first end of the capacitor 116, and electrically coupling the second end of the capacitor 124 and the second end of the capacitor 116, the capacitor 124 and the capacitor 116 may form a parallel connection, and the capacitance of the parallel connection can be the sum of the capacitance of the capacitor 124 and the capacitance of the capacitor 116.

In some embodiments, the RDL 142 and the RDL 144 may be respectively coupled to a voltage source having the same voltage level. For example, the RDL 142 and the RDL 144 may be respectively coupled to the ground of the semiconductor device 100. By electrically coupling the first end of the capacitor 124 and the first end of the capacitor 116, and respectively coupling the second end of the capacitor 124 and the second end of the capacitor 116 to the ground, the capacitor 124 and the capacitor 116 may also form a parallel connection. The capacitance of the parallel connection can be the sum of the capacitance of the capacitor 124 and the capacitance of the capacitor 116.

When the radiation device 110, e.g., the photo diode, is exposed to an incident light, the radiation device 110 may generate electrical charges, and the amount of the charges is related to the intensity or the brightness of the incident light. When the radiation device 110 and the floating diffusion region 114 are connected, the electrical charges may be stored in both the capacitor 116 and the capacitor 124, and the capacitance can be the sum of the capacitance of the capacitor 124 and the capacitance of the capacitor 116. When the image sensor structure 102 is operated in a high dynamic range, the semiconductor device 100 may need a large capacitor to store a large number of electrical charges, and the parallel connection of the capacitor 116 and the capacitor 124 located in different structures, e.g., in image sensors and in logic circuits, may provide an improved capacitor to achieve the application.

Figure 7:
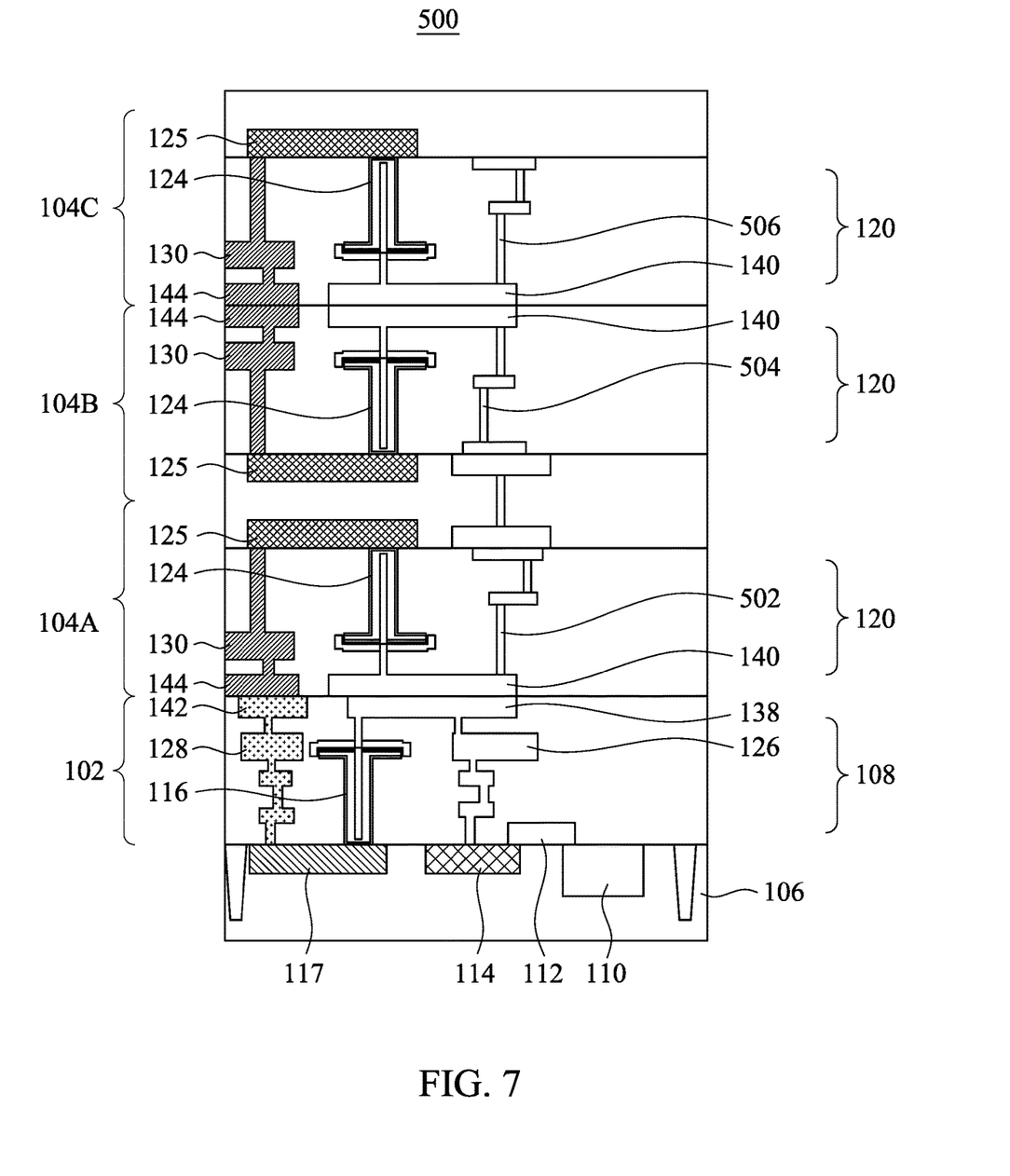
FIG. 7 is a cross-section side view of still another semiconductor device, in accordance with some embodiments.

FIG. 7 is a cross-section side view of still another semiconductor device 500, in accordance with some embodiments. The semiconductor device 500 may include the image sensor structure 102 and a plurality of periphery device structures 104A, 104B and 104C, as shown in FIG. 7. The image sensor structure 102 may include the semiconductor substrate 106 including one or more image sensors formed therein. The image sensor may include the radiation device 110 disposed in the semiconductor substrate 106, the transfer gate transistor 112 disposed on the semiconductor substrate 106 and electrically coupled to the radiation device 110, and the floating diffusion region 114 disposed in the semiconductor substrate 106 and electrically coupled to the transfer gate 112. The transfer gate transistor 112 may electrically connect and disconnect the radiation device 110 and the floating diffusion region 114. The image sensor may further include the capacitor 116 disposed in the interconnect structure 108 disposed over the semiconductor substrate 106.

Each of the periphery device structures 104A, 104B and 104C may include the interconnect structure 120 and the capacitor 124 disposed in the interconnect structure 120. It is understood that, in FIG. 7, the logic devices or the logic circuits are omitted and only the capacitors and the interconnection structures are illustrated for clear explanation of the present disclosure.

The periphery device structure 104A may be bonded to the image sensor structure 102 via hybrid bonding of the interconnect structures 108, 120. For example, the RDLs 138, 142 of the interconnect structure 108 are bonded to the RDLs 140, 144 of the interconnect structure 120, respectively, and the dielectric material 109 of the interconnect structure 108 is bonded to the dielectric material 121 of the interconnect structure 120. The periphery device structure 104B may be bonded to the periphery device structure 104C via hybrid bonding of the interconnect structures 120 of the periphery device structures 104B, 104C. For example, the RDLs 140, 144 of the periphery device structure 104B are bonded to the RDLs 140, 144 of the periphery device structure 104C, respectively, and the dielectric material 121 of the periphery device structure 104B is bonded to the dielectric material 121 of the periphery device structure 104C. The first end of the capacitor 124 in the periphery device structure 104B is bonded to the first end of the capacitor 124 in the periphery device structure 104C through the RDLs 140. When the periphery device structure 104B and the periphery device structure 104C are first formed in individual substrates, one of the periphery device structure 104B and the periphery device structure 104C may be flipped over and be bonded to the other one of the periphery device structure 104B and the periphery device structure 104C.

Then, the stack of the periphery device structure 104B and the periphery device structure 104C may be bonded to the stack of the periphery device structure 104A and the image sensor structure 102. The semiconductor device 500 further include a plurality of conductive features 502, a plurality of conductive features 504, and a plurality of conductive features 506. In some embodiments, the plurality of conductive features 502, the plurality of conductive features 504, and the plurality of conductive features 506 may be formed by the conductive lines and conductive vias to provide a conductive path through the periphery device structures 104A, 104B and 104C.

The first end of the capacitor 124 in the periphery device structure 104A is electrically coupled to the RDL 140 in the periphery device structure 104A, and is further electrically coupled to the floating diffusion region 114 through the RDL 138, and the plurality of conductive features 126. The first end of the capacitor 124 in the periphery device structure 104B is electrically coupled to the RDL 140 in the periphery device structure 104B, and the first end of the capacitor 124 in the periphery device structure 104C is electrically coupled to the RDL 140 in the periphery device structure 104C. Because the RDL 140 in the periphery device structure 104B is bonded to the RDL 140 in the periphery device structure 104C, the first end of the capacitor 124 in the periphery device structure 104B and the capacitor 124 in the periphery device structure 104C may be electrically coupled to the floating diffusion region 114 through the RDLs 140. In other words, all the first ends of the capacitors 116 and 124 are electrically coupled together and are further coupled to the floating diffusion region 114.

The second end of the capacitor 124 in the periphery device structure 104A may be electrically coupled to the second end of the capacitor 116 in the image sensor structure 102 through the conductive feature 117, the plurality of conductive features 128, the RDLs 142, 144, the plurality of conductive features 130, and the conductive feature 125. Further, the second end of the capacitor 124 in the periphery device structure 104B may be electrically coupled to the second end of the capacitor 124 in the periphery device structure 104C through the conductive feature 125 in the periphery device structure 104B, the conductive feature 130 in the periphery device structure 104B, the conductive feature 130 in the periphery device structure 104C, and the conductive feature 125 in the periphery device structure 104C.

In some embodiments, the conductive features 130 and the conductive feature 128 may be electrically coupled together. In some embodiments, the conductive features 130 and the conductive feature 128 may be respectively coupled to different voltage sources having the same voltage level, for example, the ground.

Because all the first ends of the capacitors 116 and 124 are electrically coupled together, and all of the second ends of the capacitors 116 and 124 are electrically coupled together or to the same voltage level, the capacitors 124 in the periphery device structures 104A, 104B, and 104C, and the capacitor 116 in the image sensor structure 102 may form a parallel connection, and the capacitance of the parallel connection can be the sum of the capacitance of the capacitors 124 in the periphery device structures 104A, 104B, and 104C, and the capacitor 116 in the image sensor structure 102.

It is understood, in FIG. 7, the 3D MIM capacitors are used to explain the present disclosure. However, other types of capacitors may be also applied here. For example, the capacitor formed in the image sensor structure 102 may be a 2D MIM capacitor or a 3D MIM capacitor. For another example, the capacitor formed in the periphery device structures 104A, 104B, or 104C may be a 2D MIM capacitor or a 3D MIM capacitor.

When the radiation device 110, e.g., the photo diode, is exposed to an incident light, the radiation device 110 may generate electrical charges, and the amount of the charges is related to the intensity or the brightness of the incident light. When the radiation device 110 and the floating diffusion region 114 are connected, the electrical charges may be stored in both the capacitor 116 and the capacitor 124, and the capacitance can be the sum of the capacitance of the capacitors 124 in the periphery device structures 104A, 104B, and 104C, and the capacitor 116 in the image sensor structure 102. When the image sensor structure 102 is operated in a high dynamic range, the semiconductor device 100 may need a large capacitor to store a large number of electrical charges, and the parallel connection of the capacitor 116 and the capacitors 124 located in different structures, e.g., in image sensors and in logic circuits, may provide an improved capacitor to achieve the application.

Figure 8:
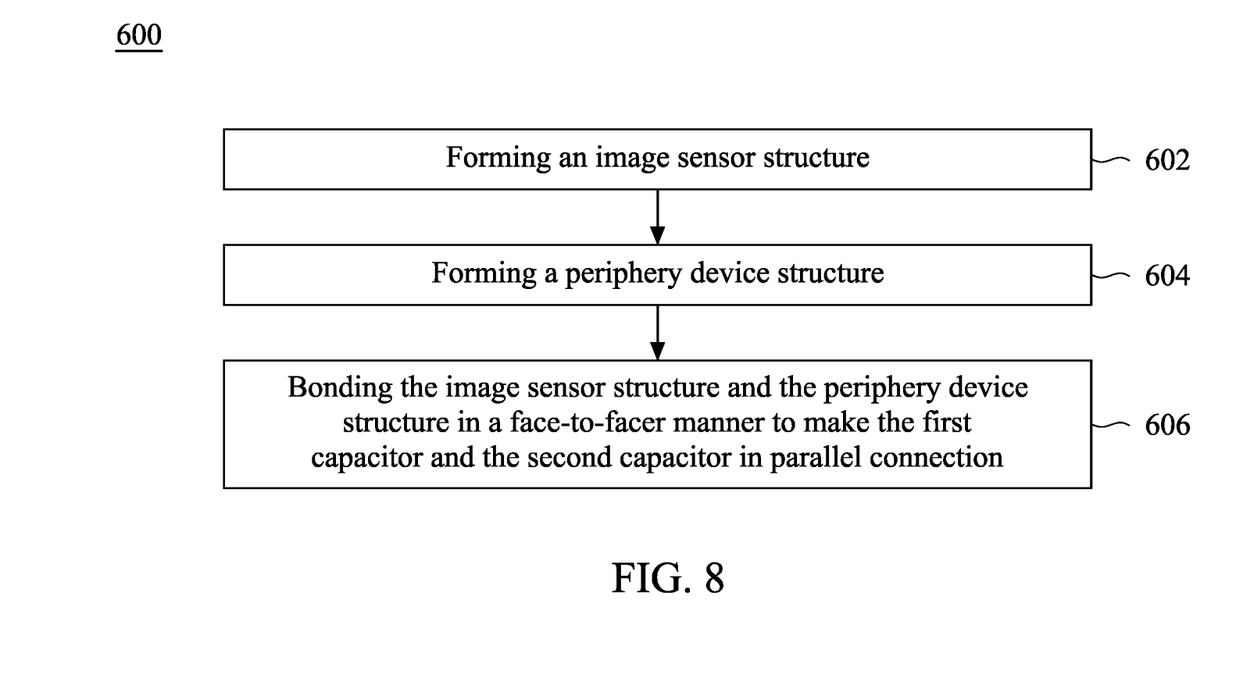
FIG. 8 is a flow chart of a method for manufacturing a semiconductor device, in accordance with some embodiments.

FIG. 8 is a flow chart of a method 600 for manufacturing the semiconductor device 100, in accordance with some embodiments. As shown in the operation 602 of FIG. 8, an image sensor structure is formed. The image sensor structure 102 may include the semiconductor substrate 106 including one or more image sensors formed therein. The image sensor may include the radiation device 110 disposed in the semiconductor substrate 106, the transfer gate transistor 112 disposed on the semiconductor substrate 106 and electrically coupled to the radiation device 110, and the floating diffusion region 114 disposed in the semiconductor substrate 106 and electrically coupled to the transfer gate 112. The transfer gate transistor 112 may electrically connect and disconnect the radiation device 110 and the floating diffusion region 114. The image sensor may further include the capacitor 116 disposed in the interconnect structure 108 disposed over the semiconductor substrate 106.

As shown in the operation 604 of FIG. 8, a periphery device structure is formed. The periphery device structure 104 may include the devices 122 formed in or above the semiconductor substrate 118. In some embodiments, the semiconductor substrate 118 may include a silicon substrate. In some embodiments, the semiconductor substrate 118 may be formed of other semiconductor materials such as silicon germanium, silicon carbon, III-V compound semiconductor materials, or the like. In some embodiments, the devices 122 may be a logic circuit including a plurality of transistors. The periphery device structure 104 may further include an interconnect structure 120 disposed on the semiconductor substrate 118, and a capacitor 124 disposed in the interconnect structure 120.

Then, as shown in the operation 606 of FIG. 8, the first interconnect structure may be bonded with the second interconnect structure to make the first capacitor and the second capacitor in parallel connection. In some embodiments, the first capacitor and the second capacitor are electrically coupled to the floating diffusion region. In some embodiments, when bonding the first interconnect structure with the second interconnect structure, the semiconductor substrate 118 may be flipped over to bond the first interconnect structure with the second interconnect structure.

In some embodiments, when bonding the first interconnect structure with the second interconnect structure, a first end of the first capacitor is electrically coupled with a first end of the second capacitor, and a second end of the first capacitor is electrically coupled with a second end of the second capacitor. In some embodiments, when bonding the first interconnect structure with the second interconnect structure, a first end of the first capacitor is electrically coupled with a first end of the second capacitor, and a second end of the first capacitor and a second end of the second capacitor are electrically coupled to different voltage sources having a same voltage level. For example, the second end of the first capacitor and the second end of the second capacitor may be respectively coupled to the ground.

In some embodiments, when bonding the first interconnect structure with the second interconnect structure, a first plurality of conductive features may be formed in the first interconnect structure, and a first end of the first capacitor and a first end of the second capacitor may be electrically coupled to the floating diffusion region through the first plurality of conductive features.

In some embodiments, a second plurality of conductive features may be formed in the first interconnect structure, and a third plurality of conductive features may be formed in the second interconnect structure. In some embodiments, a second end of the first capacitor may be electrically coupled with a second end of the second capacitor through the second plurality of conductive features and the third plurality of conductive features.

An embodiment is a semiconductor device. The semiconductor device includes an image sensor structure and a periphery device structure. The image sensor structure includes a first semiconductor substrate, a first interconnect structure disposed on the first semiconductor substrate, a radiation device disposed in the first semiconductor substrate, a transfer gate transistor disposed on the first semiconductor substrate and electrically coupled to the radiation device, a floating diffusion region disposed in the first semiconductor substrate and electrically coupled to the transfer gate, and a first capacitor disposed in the first interconnect structure. The transfer gate transistor electrically interconnects and disconnects the radiation device and the floating diffusion region. The periphery device structure includes a second interconnect structure disposed on the first interconnect structure, a second semiconductor substrate disposed on the second interconnect structure, a plurality of logic devices disposed in the second semiconductor substrate, and a second capacitor disposed in the second interconnect structure. The first capacitor and the second capacitor are electrically coupled to the floating diffusion region.

Another embodiment is a semiconductor device. The semiconductor device includes an image sensor structure and a periphery structure. The periphery structure includes a plurality of periphery devices being sequentially stacked on the image sensor structure. The image sensor structure includes a first semiconductor substrate, a first interconnect structure disposed on the first semiconductor substrate, a radiation device disposed in the first semiconductor substrate, a transfer gate transistor disposed on the first semiconductor substrate and electrically coupled to the radiation device, a floating diffusion region disposed in the first semiconductor substrate and electrically coupled to the transfer gate, and a first capacitor disposed in the first interconnect structure. The periphery structure includes a plurality of periphery devices. Each periphery device includes a second interconnect structure, and a second capacitor disposed in the second interconnect structure. A first end of the first capacitor of the image sensor structure and a first end of the second capacitor of each periphery device are electrically coupled to the floating diffusion region.

A further embodiment is a method for forming a semiconductor device. An image sensor structure is formed. The image sensor structure includes a first semiconductor substrate, a first interconnect structure disposed on the first semiconductor substrate, a radiation device disposed in the first semiconductor substrate, a transfer gate transistor disposed on the first semiconductor substrate and electrically coupled to the radiation device, a floating diffusion region disposed in the first semiconductor substrate and electrically coupled to the transfer gate, wherein the transfer gate transistor electrically interconnects and disconnects the radiation device and the floating diffusion region, and a first capacitor disposed in the first interconnect structure. A periphery device structure is formed. The periphery device structure includes a second semiconductor substrate, a second interconnect structure disposed on the second semiconductor substrate, a plurality of logic devices disposed in the second semiconductor substrate, and a second capacitor disposed in the second interconnect structure. The first interconnect structure is bonded with the second interconnect structure to make the first capacitor and the second capacitor in parallel connection. The first capacitor and the second capacitor are electrically coupled to the floating diffusion region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for forming a semiconductor device, comprising:
   forming an image sensor structure, the image sensor structure comprising:
   a first semiconductor substrate;
   a first interconnect structure disposed on the first semiconductor substrate;
   a radiation device disposed in the first semiconductor substrate;
   a transfer gate transistor disposed on the first semiconductor substrate and electrically coupled to the radiation device;
   a floating diffusion region disposed in the first semiconductor substrate and electrically coupled to the transfer gate transistor, wherein the transfer gate transistor electrically interconnects and disconnects the radiation device and the floating diffusion region;
   a first capacitor disposed in the first interconnect structure; and
   a buried conductive feature disposed in the first semiconductor substrate, wherein the buried conductive feature laterally extends from under the first capacitor to beyond a sidewall opposite side ends of the first capacitor at a bottom level of the first capacitor; and
   forming a periphery device structure, the periphery device structure comprising:
   a second semiconductor substrate;
   a second interconnect structure disposed on the second semiconductor substrate;
   a plurality of logic devices disposed in the second semiconductor substrate;
   and a second capacitor disposed in the second interconnect structure; and
   bonding the first interconnect structure with the second interconnect structure to make the first capacitor and the second capacitor in parallel connection, wherein the first capacitor and the second capacitor are electrically coupled to the floating diffusion region.

2. The method of claim 1, wherein bonding the first interconnect structure with the second interconnect structure, further comprises:
   electrically coupling a first end of the first capacitor with a first end of the second capacitor; and
   electrically coupling a second end of the first capacitor with a second end of the second capacitor.

3. The method of claim 1, wherein bonding the first interconnect structure with the second interconnect structure, further comprises:
   electrically coupling a first end of the first capacitor with a first end of the second capacitor; and
   electrically coupling a second end of the first capacitor and a second end of the second capacitor to different voltage sources having a same voltage level.

4. The method of claim 1, wherein bonding the first interconnect structure with the second interconnect structure, further comprises:
   forming a first plurality of conductive features in the first interconnect structure; and electrically coupling a first end of the first capacitor and a first end of the second capacitor to the floating diffusion region through the first plurality of conductive features.

5. The method of claim 4, further comprising:
   forming a second plurality of conductive features in the first interconnect structure;
   forming a third plurality of conductive features in the second interconnect structure;
   and electrically coupling a second end of the first capacitor with a second end of the second capacitor through the second plurality of conductive features and the third plurality of conductive features.

6. A method for forming a semiconductor device, comprising:
   forming an image sensor structure, the image sensor structure comprising:
   a radiation device;
   a transfer gate transistor electrically coupled to the radiation device;
   a floating diffusion region electrically coupled to the transfer gate transistor, wherein the transfer gate transistor electrically interconnects and disconnects the radiation device and the floating diffusion region;

a first interconnect structure disposed over the radiation device, the transfer gate transistor, and the floating diffusion region;

a first capacitor disposed in the first interconnect structure and electrically coupled to the floating diffusion region; and a buried conductive feature electrically connected to the first capacitor, wherein a top surface of the buried conductive feature is level with a top surface of the floating diffusion region; and forming a periphery device structure, the periphery device structure comprising:

a plurality of devices;

a second interconnect structure disposed over the plurality of devices; and a second capacitor disposed in the second interconnect structure; and bonding the first interconnect structure with the second interconnect structure to make the first capacitor and the second capacitor in parallel connection.

7. The method of claim 6, wherein bonding the first interconnect structure with the second interconnect structure further comprises:

electrically coupling a first end of the first capacitor with a first end of the second capacitor;

electrically coupling a second end of the first capacitor to a first conductive feature;

and electrically coupling a second end of the second capacitor to a second conductive feature.

8. The method of claim 7, wherein the first and second conductive features are electrically coupled to a voltage source.

9. The method of claim 7, wherein the first and second conductive features are electrically coupled to a ground.

10. The method of claim 7, wherein the first conductive feature is formed in the first interconnect structure, and the second conductive feature is formed in the second interconnect structure.

11. The method of claim 10, wherein bonding the first interconnect structure with the second interconnect structure further comprises bonding the first conductive feature with the second conductive feature.

12. The method of claim 6, wherein the plurality of devices comprises a plurality of transistors, row selectors, source followers, and reset transistors.

13. The method of claim 6, wherein the first capacitor and the second capacitor are electrically coupled to the floating diffusion region.

14. The method of claim 13, wherein the first and second capacitors are electrically coupled to the floating diffusion region via a plurality of conductive features.

15. The method of claim 14, wherein the plurality of conductive features are formed in the first interconnect structure.

16. A method for forming a semiconductor device, comprising:

forming a floating diffusion region in a semiconductor substrate;

forming a conductive feature in the semiconductor substrate;

forming a first capacitor in a first interconnect structure over the semiconductor substrate and in physical contact with the conductive feature;

forming a first redistribution layer in the first interconnect structure, wherein the first redistribution layer is electrically coupled to the first capacitor, the conductive feature, and the floating diffusion region;

forming a second capacitor in a second interconnect structure;

forming a second redistribution layer in the second interconnect structure, wherein the second redistribution layer is electrically coupled to the second capacitor; and bonding the first interconnect structure with the second interconnect structure to make the first capacitor and the second capacitor in parallel connection.

17. The method of claim 16, further comprising forming a radiation device in the semiconductor substrate.

18. The method of claim 17, wherein the radiation device is a photo diode.

19. The method of claim 17, further comprising forming a gate transistor electrically coupled to the radiation device and the floating diffusion region.

20. The method of claim 16, wherein the first and second capacitors are metal-insulator-metal capacitors.

\* \* \* \* \*